(12) United States Patent
Goddard et al.

(10) Patent No.: US 8,404,159 B2
(45) Date of Patent: Mar. 26, 2013

(54) SOLVENT FOR A PRINTING COMPOSITION

(75) Inventors: Simon James Goddard, Impington (GB); Paul Wallace, Royston (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 76 days.

(21) Appl. No.: 12/920,319

(22) PCT Filed: Feb. 24, 2009

(86) PCT No.: PCT/GB2009/000516
§ 371 (c)(1),
(2), (4) Date: Sep. 24, 2010

(87) PCT Pub. No.: WO2009/109738
PCT Pub. Date: Sep. 11, 2009

(65) Prior Publication Data
US 2011/0008590 A1    Jan. 13, 2011

(30) Foreign Application Priority Data
Mar. 3, 2008    (GB) .................................... 0803950.5

(51) Int. Cl.
*H01B 1/00*     (2006.01)
*H01L 29/08*    (2006.01)
*H01L 51/40*    (2006.01)

(52) U.S. Cl. .............................. 252/500; 257/40; 438/99

(58) Field of Classification Search .................... 257/40; 252/500–521.6; 438/99
See application file for complete search history.

(56) References Cited

U.S. PATENT DOCUMENTS
(Continued)

FOREIGN PATENT DOCUMENTS
EP    0686662 A2    2/1995
EP    0880303 A1   11/1998
(Continued)

OTHER PUBLICATIONS

International Search Report and Written Opinion for PCT/GB2009/000516 dated Jun. 12, 2009.
(Continued)

*Primary Examiner* — Mark Kopec
*Assistant Examiner* — Jaison Thomas
(74) *Attorney, Agent, or Firm* — Marshall, Gerstein & Borun LLP

(57) ABSTRACT

A composition suitable for fabricating an electronic device such as an OLED using an ink-jet printing technique comprises a conducting or semi-conducting organic material and a solvent, the solvent having a boiling point of greater than 250° C. and a viscosity of less than 5 cPs. The composition preferably has a viscosity in the range between 0.1 and 20 cPs, and the solvent preferably has the formula:

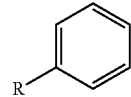

where R represents a $C_6$ to $C_{11}$ alkyl. The high boiling point of the solvent allows the "ink" to remain wet for a longer time after printing. This provides better process control during drying, resulting in more uniform films and greater control over the film profile. The low viscosity of the solvent enables jetting of the composition at high frequencies.

23 Claims, 2 Drawing Sheets

U.S. PATENT DOCUMENTS

| | | | |
|---|---|---|---|
| 4,080,414 | A | 3/1978 | Anderson et al. |
| 5,091,004 | A | 2/1992 | Tabayashi et al. |
| 5,723,873 | A | 3/1998 | Yang |
| 5,798,170 | A | 8/1998 | Zhang et al. |
| 6,268,695 | B1 | 7/2001 | Affinito |
| 6,878,312 | B1 | 4/2005 | Kanbe et al. |
| 2007/0254185 | A1 | 11/2007 | Uchino et al. |
| 2008/0038488 | A1 | 2/2008 | Yamamoto |

FOREIGN PATENT DOCUMENTS

| | | | |
|---|---|---|---|
| EP | 0 901 176 A2 | | 3/1999 |
| EP | 0 947 123 A1 | | 10/1999 |
| EP | 0949850 A1 | | 10/1999 |
| EP | 0 989 778 A1 | | 3/2000 |
| EP | 1083775 A1 | | 3/2001 |
| GB | 2 348 316 | | 9/2000 |
| JP | 2006241309 A | | 9/2006 |
| KR | 635153 B | | 10/2006 |
| WO | WO-9857381 A1 | | 12/1998 |
| WO | WO-9912398 A1 | | 3/1999 |
| WO | WO-9929789 A1 | | 6/1999 |
| WO | WO-99/48160 A1 | | 9/1999 |
| WO | WO-9954385 A1 | | 10/1999 |
| WO | WO-0048258 A1 | | 8/2000 |
| WO | WO-0053656 A1 | | 9/2000 |
| WO | WO-0059267 A1 | | 10/2000 |
| WO | WO-0116251 A1 | | 3/2001 |
| WO | WO-0119142 A1 | | 3/2001 |
| WO | WO 01/70506 | | 9/2001 |
| WO | WO-0181649 A1 | | 11/2001 |
| WO | WO-0218513 | | 3/2002 |
| WO | WO-02066552 A1 | | 8/2002 |
| WO | WO-02084759 A1 | | 10/2002 |
| WO | WO-03/083960 A1 | | 10/2003 |
| WO | WO-2004/023573 A2 | | 3/2004 |
| WO | WO-2006123167 A1 | | 11/2006 |
| WO | WO 2007/082584 | * | 7/2007 |

OTHER PUBLICATIONS

Combined Search and Examination Resort for GB0803950.5 dated Aug. 1, 2008.

Bernius et al., "Progress with Light-Emitting Polymers," *Adv. Matter*, 12:1737-1750 (2000).

Michaelson, "The work function of the elements and its periodicity," *J. Appl. Phys.*, 48:4729-4733 (1977).

Niu et al., "Thermal annealing below the glass transition temperature: A general way to increase performance of light-emitting diodes based on copolyfluorenes," *Applied Physics letters*, 81:634-636 (2002).

Tokito et al., "Metal oxides as a hole-injecting layer for an organic electroluminescent device," *J. Phys. D: Appl. Phys*, 29:2750-2753 (1996).

Yamaguchi et al., "Effects of B and C on the ordering of $L1_0$-CoPt thin films," *Applied Physics Letters*, 79:2001-2003 (2001).

\* cited by examiner

SOLVENT FOR A PRINTING COMPOSITION

BACKGROUND OF THE INVENTION

1. Field of the Invention

The present invention relates to a composition comprising a conducting or semi-conducting organic material and a solvent, the composition being suitable for deposition by a printing technique in the manufacture of an organic electronic device such as, for example, an organic light emitting device.

2. Related Technology

A typical organic light-emitting device (OLED) comprises a substrate, on which is supported an anode, a cathode and a light-emissive layer situated in between the anode and cathode and comprising at least one polymeric electroluminescent material. In operation, holes are injected into the device via the anode and electrons are injected into the device via the cathode. The holes and electrons combine in the light-emissive layer to form an exciton, which then undergoes radiative decay to emit light.

Other layers may be present in the device, for example a layer of conductive hole injection material, such as poly(ethylene dioxythiophene)/polystyrene sulphonate (PEDOT/PSS), may be provided between the anode and the light-emissive layer to assist injection of holes from the anode to the light-emissive layer. Further, a hole transport layer made from a hole transport material may be provided between the anode and the light-emissive layer to assist transport of holes to the light-emissive layer.

Luminescent conjugated polymers are an important class of materials that will be used in organic light emitting devices for the next generation of information technology based consumer products. The principle interest in the use of polymers, as opposed to inorganic semiconducting and organic dye materials, lies in the capability for low-cost device manufacturing, using solution-processing of film-forming materials. Since the last decade much effort has been devoted to the improvement of the emission efficiency of organic light emitting diodes (OLEDs) either by developing more efficient materials or device structures.

A further advantage of conjugated polymers is that they may be readily formed by Suzuki or Yamamoto polymerization. This enables a high degree of control over the regioregulatory of the resultant polymer.

Conjugated polymers may be solution processable due to the presence of appropriate solubilising groups. Suitable solvents for polyarylenes, in particular polyfluorenes, include mono- or poly-alkylbenzenes such as toluene and xylene. Particularly preferred solution deposition techniques are spin-coating and inkjet printing.

Spin-coating is particularly suitable for devices where patterning of the electroluminescent material is unnecessary, for example for lighting applications, or simple monochrome segmented displays.

Ink-jet printing is particularly suitable for high information content displays, in particular full color displays.

Other solution deposition techniques for which the present composition is suitable include dip-coating, roll printing and screen printing.

Inkjet printing of luminescent layers of OLEDs is described in, for example, EP 0 880 303.

EP 1 083 775 discloses a composition which can be used in an inkjet printing method. The composition consists of a functional material and a solvent comprising at least one benzene derivative, which has one or more substituents, and three substituents have three or more carbon atoms in total. The following solvents are mentioned: cumene, cymene, cyclohexylbenzene, dodecylbenzene, diethylbenzene, pentylbenzene, dipentylbenzene, butylbenzene, tetralin and tetramethylbenzene. Dodesylbenzene is used as the solvent for red, green and blue luminescent materials in example 2-2 of EP 1083775.

JP 2006-241309 discloses an inkjet composition comprising a diphenylether, for example 3-phenoxytoluene.

WO 01/16251 discloses a formulation for depositing a conjugated polymer layer in a light emitting device. A formulation for depositing a polymer layer in a light emitting device is disclosed where the formulation comprises a conjugated polymer dissolved in a solvent, the solvent comprising at least one substance selected from the groups consisting of terpenes and alkylated aromatic compounds. Preferred polyalkylated aromatic compounds are said to include polyalkyl benzenes such as cymene and isodurenes. According to one embodiment, the solvent comprises at least one aromatic compound substituted with alkyl groups at no less than 3 positions. Dialkyl-benzenes such as diethylbenzene and 1-methyl-4-t-butyl benzene are also disclosed.

WO2006/123167 is concerned with compositions for ink-jet printing conductive or semi-conductive organic material for us in manufacturing opto-electrical devices. It is said in WO2006/123167 that a charge injecting layer may be deposited as a composition comprising a conductive organic material in a high boiling point solvent. PEDOT:PSS is exemplified as a conductive organic material.

WO 2006/123167 also discloses a composition comprising an organic electroluminescent material and a solvent having a boiling point higher than water.

The following high boiling point solvents are disclosed in WO2006/123167: ethylene glycol, glycerol, diethylene glycol, propylene glycol, butane 1,4 diol, propane 1,3 diol, dimethyl-2-imidazolidinone, N-methyl-2-pyrrolidone and dimethylsulfoxide.

The key reasons for the interest in ink jet printing are scalability and adaptability. The former allows arbitrarily large sized substrates to be patterned: the latter means that there should be negligible tooling costs associated with changing from one product to another, since the image of dots printed on a substrate is defined by software. At first sight this would be similar to printing a graphic image—commercial print equipment is available that allow printing of arbitrary images on billboard sized substrates [Inca digital website: http://www.incadigital.com/]. However the significant difference between graphics printers and display panels is the former use substrates that are porous or use inks that are UV curable, resulting in very little effect of the drying environment on film formation. In comparison, the inks used in fabricating OLED displays are ink jet printed onto non-porous surfaces, and the process of changing from a wet ink to dry film is dominated by the drying environment of the ink in the pixel. Since the printing process involves printing stripes (or swathes) of ink (corresponding to the ink jet head width) there is an inbuilt asymmetry in the drying environment. In addition OLED devices require the films to be uniform to nanometer tolerance. It follows that to achieve scalability and adaptability requires control of the film forming properties of the ink and a robustness of this process to changes in pixel dimensions and swathe timing.

It is important to use material formulations with which thin polymer films exhibiting excellent uniformity can be produced. In this respect, it is important to use formulations which exhibit the desired properties with respect to surface tension, viscosity, concentration, and contact angle (on the depositing medium and the substrate onto which it is to be deposited), and which preferably also exhibit good solution stability.

GENERAL DESCRIPTION

The present inventors have identified a need to provide further compositions suitable for deposition by ink-jet printing.

Thus, a first aspect of the present invention provides a composition suitable for fabricating an electronic device using a printing technique such as ink jet printing, roll printing, or screen printing, the composition comprising a conducting or semiconducting organic material and a solvent, the solvent having a boiling point of greater than 250° C. and a viscosity of less than 5 cPs.

Viscosity values as mentioned in the present description and claims refer to dynamic viscosity values measured at 20° C. using, for example, a TA-AR1000 controlled stress rheometer with cone and plate geometry. Shear rates in the range 0-1000 s$^{-1}$ were used, under which conditions the solvents and inks described are Newtonian or near-Newtonian fluids.

The high boiling point of the solvent used in the composition according to the present invention has the advantages of causing or allowing the "ink" to remain wet for a longer time after printing. This results in better process control during drying, resulting in more uniform films and better control over the film profile. Further, the low viscosity of the solvent enables jetting of the composition at high frequencies, such as greater than 6 kHz. The solvent also enables the composition to be formulated with a high solids content (i.e. a high concentration of the conducting or semi-conducting organic material).

Preferably, the solvent has formula I:

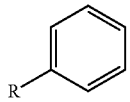

I where R represents a linear or branched $C_6$ to $C_{11}$ alkyl, alkoxy, alkylthio or alkylamino. One or more further R groups may be present as substituents on the phenyl ring.

Preferably, R represents a $C_7$ to $C_{11}$ alkyl, more preferably a $C_8$ to $C_{10}$ alkyl, most preferably a $C_9$ alkyl.

Preferably, R represents a linear $C_7$ to $C_{11}$ alkyl, more preferably a linear $C_8$ to $C_{10}$ alkyl, most preferably linear $C_9$ alkyl.

Preferably, the solvent has a boiling point of at least 261° C. Preferably, the solvent has a viscosity of less than 4 cPs. Preferably the solvent does not have oxygen atoms in the solvent molecules.

It will be appreciated in relation to the composition according to the present invention that the conducting or semiconducting organic material is soluble in the solvent having a boiling point above 250° C. and a viscosity below 5 cPs. The present inventors were surprised to discover that conducting or semi-conducting organic materials are indeed soluble in such a solvent.

Further, the solvent having formula I is advantageous in so far as it has been found to enable a composition having a desirable viscosity in combination with a high solids content. Preferably, the viscosity of the final formulation is 0.1-20 cPs, more preferably in the range 3-12 cPs, and most preferably in the range 8-10 cPs. The viscosity can be controlled by solids content loading.

A high solids content is desirable, since it can allow printing of a desired layer thickness in one print, rather than requiring two or more prints.

A solvent having formula I defined above typically has a viscosity of between 0.1 and 5 cPs, more preferably between 1 and 4 cPs, and most preferably in the ranges 2.7 to 3.9 cPs, or 3 to 4 cPs.

Further, a solvent having formula I defined above typically has a boiling point of at least 250° C., more typically at least 261° C. For such high boiling point solvents, one skilled in the art would predict a much higher viscosity of the solvent. Thus, the composition according to the present invention provides the advantages of a high boiling point solvent in combination with the advantages of a desirable viscosity, which allow printing techniques such as ink-jet printing, roll printing, or screen printing to be used to deposit the composition as a thin film or layer.

Preferred solvents include the following:

| SOLVENT | Boiling Point/° C. | Viscosity/cPs |
|---|---|---|
| phenyloctane | 261 | 2.7 |
| phenylnonane | 282 | 3.2 |
| phenyldecane | 293 | |
| phenyldodecane | 331 | |
| 1,3-dimethylnaphthalene | 263 | 3.9 |
| Isoamylbenzoate | 262 | 3.9 |

Ink-jet printing is of particular interest.

A single solvent may be used i.e. the solvent having formula I.

Alternatively, the composition may have a solvent blend. A solvent blend allows further control over the viscosity of the composition. A solvent blend may comprise a first solvent having a boiling point of at least 250° C. and a viscosity below 5 cPs, together with a second solvent having a higher or lower boiling point, preferably a lower boiling point. A preferred second solvent is selected from the group consisting of: benzene substituted with one or more of alkyl alkoxy, alkylthio or alkylamino substituents, for example 4-methylanisole, mesitylene, butylbenzene and ortho-xylene. Preferably, the second solvent has a boiling point of less than 250° C. and has a viscosity in the range 1-5 cPs. A preferred solvent blend is a 1:1 blend of the first solvent and a second solvent having a lower boiling point. Such a blend has been found to result in a particularly good, flat film being formed.

Preferably the conducting or semi-conducting organic material comprises a polymer. The polymer may be cross linkable due to the presence of cross linkable groups.

The jetting properties of the composition are strongly dependent on the solids content, which may be determined by gravimetric analysis, wherein solvent is evaporated from a measured weight or volume of the ink to dryness. The solids content may be determined by weighing the solid material remaining, and calculating the loss on drying of solvent.

It will be understood that the solids content will be selected with consideration for the desired viscosity of the composition.

The conducting or semi-conducting organic material preferably is a semiconducting material.

The conducting or semi-conducting organic material may be a semi-conducting luminescent material. Preferably, the concentration of the semi-conducting luminescent material in the composition is in the range of from 0.1% to 5% w/v, more preferably in the range of from 0.8% to 1.2% w/v for polymer materials in the range of 100-1,500,000 Daltons Mw.

The conducting or semi-conducting organic material may be a semi-conducting charge transport material, in particular a semi-conducting hole transport material. Preferably, the concentration of the semi-conducting hole transport material in the composition is up to 0.8 w/v %, more preferably in the range of from 0.2 to 0.5 w/v %.

The conducting or semi-conducting organic material may be a conducting hole injection material. Preferably, the concentration of the hole injection material in the composition is in the range of from 0.1 to 4 w/v %.

Preferably the semi-conducting luminescent material comprises a luminescent polymer, more preferably a conjugated polymer. Preferably the luminescent polymer has an absolute molecular weight in the range of more than 500, more preferably 200-300 kiloDaltons Mw.

Preferably the semi-conducting charge transport material (in particular a hole transport material) comprises a charge transport polymer, more preferably a conjugated polymer. Preferably the charge transport polymer has an absolute molecular weight in the range of at least 40 kiloDaltons Mw, more preferably in the range of 180 kiloDaltons to 500 kiloDaltons.

The absolute molecular weight of a polymer in a composition according to the present invention may be determined by Gel Permeation Chromatography (GPC) relative to polystyrene standard.

Preferred semi-conducting hole transport polymers comprise a triarylamine repeat unit. Preferred triarylamine repeat units satisfy general Formula 1:

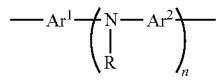

1 wherein $Ar^1$ and $Ar^2$ are optionally substituted aryl or heteroaryl groups, n is greater than or equal to 1, preferably 1 or 2, and R1 is H or a substituent, preferably a substituent. R1 is preferably alkyl or aryl or heteroaryl, most preferably aryl or heteroaryl. Any of the aryl or heteroaryl groups in the unit of formula 1 may be substituted. Preferred substituents include alkyl and alkoxy groups. Any of the aryl or heteroaryl groups in the repeat unit of Formula 1 may be linked by a direct bond or a divalent linking atom or group. Preferred divalent linking atoms and groups include O, S; substituted N; and substituted C.

Particularly preferred units satisfying Formula 1 include units of Formulae 2-4:

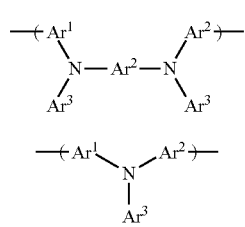

2

3

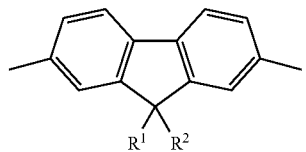

4 wherein $Ar^1$ and $Ar^2$ are as defined above; and $Ar^3$ is optionally substituted aryl or heteroaryl. Where present, preferred substituents for $Ar^3$ include alkyl and alkoxy groups.

Particularly preferred hole transporting polymers of this type are copolymers (particularly AB copolymers) of a triarylamine repeat unit and a second repeat unit. The second repeat unit preferably is a fluorene repeat unit, more preferably a repeat unit of Formula 5:

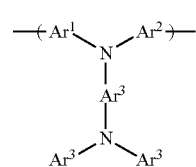

5 wherein $R^1$ and $R^2$ are independently selected from hydrogen or optionally substituted alkyl, alkoxy, aryl, arylalkyl, heteroaryl and heteroarylalkyl. More preferably, at least one of $R^1$ and $R^2$ comprises an optionally substituted $C_4$-$C_{20}$ alkyl or aryl group.

Preferred conducting hole injection materials comprise a conducting organic or inorganic material, which is typically doped. Examples of doped organic hole injection materials include doped poly(ethylene dioxythiophene) (PEDT), in particular PEDT doped with a charge-balancing polyacid such as polystyrene sulfonate (PSS) as disclosed in EP 0 901 176 and EP 0 947 123, polyacrylic acid or a fluorinated sulfonic acid, for example Nafion®; polyaniline as disclosed in U.S. Pat. No. 5,723,873 and U.S. Pat. No. 5,798,170; and poly(thienothiophene). Examples of conductive inorganic materials include transition metal oxides such as VOx MoOx and RuOx as disclosed in Journal of Physics D: Applied Physics (1996), 29(11), 2750-2753.

The composition of the present invention may comprise a low boiling solvent, as described above. Additionally, or alternatively, it will be appreciated that other materials may be included in the composition, for example a further high boiling solvent may be included. Other, non solubilising agents such as a surface wetting agent (e.g. an alkoxy ether) may also be included.

A second aspect of the present invention provides a method of forming an organic light-emitting device including depositing a composition as defined in relation to the first aspect to form a layer.

Preferably, deposition is by ink-jet printing, roll printing or screen printing.

In the embodiment where the conducting or semi-conducting organic material is a semi-conducting hole transport material, the method preferably includes a further step of baking the layer by heating. Baking the semi-conducting hole transport layer is followed by deposition of a luminescent layer. Baking conditions should be selected so that at least a part of the semi-conducting hole transport layer is rendered insoluble so that the luminescent layer can be deposited without dissolving the semi-conducting hole transport layer. The semi-conducting hole transport material may comprise cross-linkable groups that crosslink during baking in order to render the resultant layer insoluble. Alternatively, the material may be substantially free of cross-linkable groups in which case the semi-conducting hole transport layer may still be rendered insoluble by baking for example as described in WO 2004/023573. A suitable temperature for baking is in the range from 180 to 220° C. Preferably, baking at the desired temperature is carried out for between 5 and 60 minutes.

In the method according to the second aspect of the present invention, precision ink-jet printers such as machines from Litrex Corporation of California, USA may be used; suitable print heads are available from Xaar of Cambridge, UK and Spectra, Inc. of NH, USA.

Preferably, in the method according to the second aspect of the present invention, the thickness of the semi-conducting luminescent layer is in the range from 30 to 120 nm, more preferably from 50 to 90 nm.

Preferably, in the method according to the second aspect of the present invention, the thickness of the semi-conducting hole transport layer is in the range from 10 to 40 nm, more preferably from 15 to 40 nm.

Preferably, in the method according to the second aspect of the present invention, the thickness of the conducting hole injection layer is in the range from 30 to 200 nm, more preferably from 50 to 130 nm.

In the method according to the second aspect of the present invention, the method typically will include steps of:
1. providing an anode layer;
2. optionally providing a conducting hole injecting layer on the anode layer;
3. optionally providing a semi-conducting hole transport layer on the anode layer (or hole injecting layer, where present);
4. providing a luminescent layer on the anode layer (or conducting hole injecting layer or semi-conducting hole transport layer, where present);
5. optionally providing an electron transport layer on the luminescent layer; and
6. providing a cathode on the luminescent layer (or electron transport layer, where present). Any one, two or all of the conducting hole injecting layer, semi-conducting hole transport layer, and luminescent layer may be formed by deposition of a composition according to the first aspect of the invention. The above process steps 1 to 6 may be performed in reverse order, thus providing an OLED with a cathode at the bottom.

It will be understood that in the second aspect of the present invention, preferably, the method includes a step of removing the solvent from the composition according to the first aspect after formation of the layer. Preferred methods for removing the solvent(s) include vacuum drying at ambient and elevated temperature, where the temperature is up to 150° C. Baking prior to the deposition of the cathode may be beneficial to ensure the solvents have been removed from the film.

In the method according to the second aspect of the present invention, it will be appreciated that when ink-jet printing is used, printing generally will be into a pixel defined by bank structures. In this connection, the desired viscosity of the composition will, to some extent, be dependent on the pixel size, drop diameter, drop volume, drop frequency, and wettability of the surface onto which the composition is being deposited. For small pixels a higher solids content is generally used. For larger pixels a lower solid content is used. For larger pixels, the concentration of the composition is reduced to get good film forming properties.

Preferably, the composition should have a contact angle with the bank such that it does not wet the bank but does flood out of the well.

A third aspect of the present invention provides an organic semiconductor device made by a method according to the second aspect of the invention. Such devices may comprise light emitting devices such as diodes (OLED), Thin Film Transistors (OTFT) and organic photodetectors (OPD)

The device may comprise a full color display, or a light source comprising an organic light-emitting device.

Preferred features of the device according to the third aspect of the present invention are provided below.

With reference to FIG. 1, the architecture of an electroluminescent device according to the third aspect of the invention preferably comprises a (typically transparent glass or plastic) substrate 1, an anode 2 and a cathode 4. A luminescent layer 3 is provided between anode 2 and cathode 4.

In a practical device, at least one of the electrodes is semi-transparent in order that light may be emitted. Where the anode is transparent, it typically comprises indium tin oxide.

A semiconducting hole transport layer is present between anode 2 and luminescent layer 3. Further layers may be located between anode 2 and cathode 3, such as charge transporting, charge injecting or charge blocking layers.

In particular, it is desirable to provide a conducting hole injection layer, which may be formed from a conducting organic or inorganic material between the anode 2 and the semiconducting hole transport layer to assist hole injection from the anode into the semiconducting hole transport layer. Examples of doped organic hole injection materials include doped poly(ethylene dioxythiophene) (PEDT), in particular PEDT doped with a charge-balancing polyacid such as polystyrene sulfonate (PSS) as disclosed in EP 0 901 176 and EP 0 947 123, polyacrylic acid or a fluorinated sulfonic acid, for example Nafion®; polyaniline as disclosed in U.S. Pat. No. 5,723,873 and U.S. Pat. No. 5,798,170; and poly(thienothiophene). Examples of conductive inorganic materials include transition metal oxides such as VOx MoOx and RuOx as disclosed in Journal of Physics D: Applied Physics (1996), 29(11), 2750-2753.

The hole transporting layer located between anode 2 and luminescent layer 3 preferably has a HOMO level of less than or equal to 5.5 eV, more preferably around 4.8-5.5 eV. HOMO levels may be measured by cyclic voltammetry, for example.

If present, an electron transporting layer located between electroluminescent layer 3 and cathode 4 preferably has a LUMO level of around 3-3.5 eV.

The present invention provides a device comprising an organic light-emitting device. The device may be a full color display or a light source, for example.

A preferred full color display comprises "red" pixels, "green" pixels and "blue" pixels, each pixel comprising an OLED as defined in relation to the second aspect. A "red" pixel will have a luminescent layer comprising a red electroluminescent material. A "green" pixel will have a luminescent layer comprising a green electroluminescent material. A "blue" pixel will have a luminescent layer comprising a blue electroluminescent material.

"Red electroluminescent material" means an organic material that by electroluminescence emits radiation having a wavelength in the range of 600-750 nm, preferably 600-700 nm, more preferably 610-650 nm and most preferably having an emission peak around 650-660 nm. "Green electroluminescent material" means an organic material that by electroluminescence emits radiation having a wavelength in the range of 510-580 nm, preferably 510-570 nm. "Blue electrolumi-nescent material" means an organic material that by electroluminescence emits radiation having a wavelength in the range of 400-500 nm, more preferably 430-500 nm. Red, green and blue electroluminescent materials are known in the art.

BRIEF DESCRIPTION OF THE DRAWINGS

The present invention will now be described in more detail, with reference to the attached Figures, in which.

DETAILED DESCRIPTION

Figure 1:
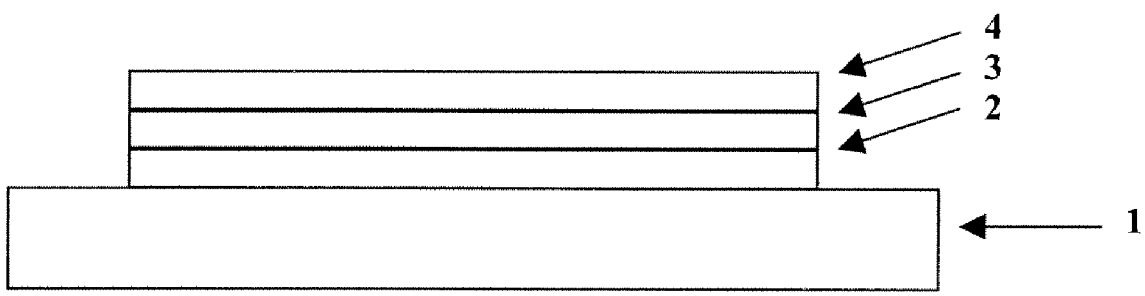
FIG. 1 shows the architecture of a typical OLED.

Referring to the device according to the third aspect, luminescent layer 3 may consist of luminescent material alone or may comprise the luminescent material in combination with one or more further materials. In particular, the luminescent material may be blended with hole and/or electron transporting materials as disclosed in, for example, WO 99/48160, or may comprise a luminescent dopant in a semi-conducting host matrix. Alternatively, the luminescent material may be covalently bound to a charge transporting material and/or host material.

Luminescent layer 3 may be patterned or un-patterned. A device comprising an un-patterned layer may be used as an illumination source, for example. A white light emitting device is particularly suitable for this purpose. A device comprising a patterned layer may be, for example, an active matrix display or a passive matrix display. In the case of an active matrix display, a patterned electroluminescent layer is typically used in combination with a patterned anode layer and an un-patterned cathode. In the case of a passive matrix display, the anode layer is formed of parallel stripes of anode material, and parallel stripes of electroluminescent material and cathode material arranged perpendicular to the anode material wherein the stripes of electroluminescent material and cathode material are typically separated by stripes of insulating material ("cathode separators") formed by photolithography.

Suitable materials for use in luminescent layer 3 include small molecule, polymeric and dendrimeric materials, and compositions thereof. Suitable electroluminescent polymers for use in layer 3 include poly(arylene vinylenes) such as poly(p-phenylene vinylenes) and polyarylenes such as: polyfluorenes, particularly 2,7-linked 9,9 dialkyl polyfluorenes or 2,7-linked 9,9 diaryl polyfluorenes; polyspirofluorenes, particularly 2,7-linked poly-9,9-spirofluorene; polyindenofluorenes, particularly 2,7-linked polyindenofluorenes; polyphenylenes, particularly alkyl or alkoxy substituted poly-1,4-phenylene. Such polymers as disclosed in, for example, Adv. Mater. 2000 12(23) 1737-1750 and references therein. Suitable electroluminescent dendrimers for use in layer 3 include electroluminescent metal complexes bearing dendrimeric groups as disclosed in, for example, WO 02/066552.

Cathode 4 is selected from materials that have a workfunction allowing injection of electrons into the luminescent layer. Other factors influence the selection of the cathode such as the possibility of adverse interactions between the cathode and the electroluminescent material. The cathode may consist of a single material such as a layer of aluminium. Alternatively, it may comprise a plurality of metals, for example a bilayer of a low workfunction material and a high workfunction material such as calcium and aluminium as disclosed in WO 98/10621; elemental barium as disclosed in WO 98/57381, Appl. Phys. Lett. 2002, 81(4), 634 and WO 02/84759; or a thin layer of metal compound, in particular an oxide or fluoride of an alkali or alkali earth metal, to assist electron injection, for example lithium fluoride as disclosed in WO 00/48258; barium fluoride as disclosed in Appl. Phys. Lett. 2001, 79(5), 2001; and barium oxide. In order to provide efficient injection of electrons into the device, the cathode preferably has a workfunction of less than 3.5 eV, more preferably less than 3.2 eV, most preferably less than 3 eV. Work functions of metals can be found in, for example, Michaelson, J. Appl. Phys. 48(11), 4729, 1977.

The cathode may be opaque or transparent. Transparent cathodes are particularly advantageous for active matrix devices because emission through a transparent anode in such devices is at least partially blocked by drive circuitry located underneath the emissive pixels. A transparent cathode will comprises a layer of an electron injecting material that is sufficiently thin to be transparent. Typically, the lateral conductivity of this layer will be low as a result of its thinness. In this case, the layer of electron injecting material is used in combination with a thicker layer of transparent conducting material such as indium tin oxide.

It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminium. Examples of transparent cathode devices are disclosed in, for example, GB 2 348 316.

Optical devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0 949 850.

The device is preferably encapsulated with an encapsulant (not shown in FIG. 1) to prevent ingress of moisture and oxygen. Suitable encapsulants include a sheet of glass, films having suitable barrier properties such as alternating stacks of polymer and dielectric as disclosed in, for example, WO 01/81649 or an airtight container as disclosed in, for example, WO 01/19142. A getter material for absorption of any atmospheric moisture and/or oxygen that may permeate through the substrate or encapsulant may be disposed between the substrate and the encapsulant.

The embodiment of FIG. 1 illustrates a device wherein the device is formed by firstly forming an anode on a substrate followed by deposition of an luminescent layer and a cathode, however it will be appreciated that the device of the invention could also be formed by firstly forming a cathode on a substrate followed by deposition of a luminescent layer and an anode.

Polymerization Methods

Preferred methods for preparation of semiconducting polymers are Suzuki Polymerization as described in, for example, WO 00/53656 and Yamamoto Polymerization as described in, for example, T. Yamamoto, "Electrically Conducting And Thermally Stable π-Conjugated Poly(arylene)s Prepared by Organometallic Processes", Progress in Polymer Science 1993, 17, 1153-1205. These Polymerization techniques both operate via a "metal insertion" wherein the metal atom of a metal complex catalyst is inserted between an aryl group and a leaving group of a monomer. In the case of Yamamoto Polymerization, a nickel complex catalyst is used; in the case of Suzuki Polymerization, a palladium complex catalyst is used.

For example, in the synthesis of a linear polymer by Yamamoto Polymerization, a monomer having two reactive halogen groups is used. Similarly, according to the method of Suzuki Polymerization, at least one reactive group is a boron derivative group such as a boronic acid or boronic ester and the other reactive group is a halogen. Preferred halogens are chlorine, bromine and iodine, most preferably bromine.

It will therefore be appreciated that repeat units and end groups comprising aryl groups as illustrated throughout this application may be derived from a monomer carrying a suitable leaving group.

Suzuki Polymerization may be used to prepare regioregular, block and random copolymers. In particular, homopolymers or random copolymers may be prepared when one reactive group is a halogen and the other reactive group is a boron derivative group. Alternatively, block or regioregular, in particular AB, copolymers may be prepared when both reactive groups of a first monomer are boron and both reactive groups of a second monomer are halogen.

Suzuki polymerization may be used to prepare regioregular, block and random copolymers. In particular, homopolymers or random copolymers may be prepared when one reactive group is a halogen and the other reactive group is a boron derivative group. Alternatively, block or regioregular, in particular AB, copolymers may be prepared when both reactive groups of a first monomer are boron and both reactive groups of a second monomer are halogen.

OLEDs may be deposited on a substrate in a matrix of pixels to form a single or multi-color pixilated display. A multicolored display may be constructed using groups of red, green, and blue emitting pixels. So-called active matrix displays have a memory element, typically a storage capacitor and a transistor, associated with each pixel. Passive matrix displays have no such memory element, and instead are repetitively scanned to give the impression of a steady image.

Figure 2:
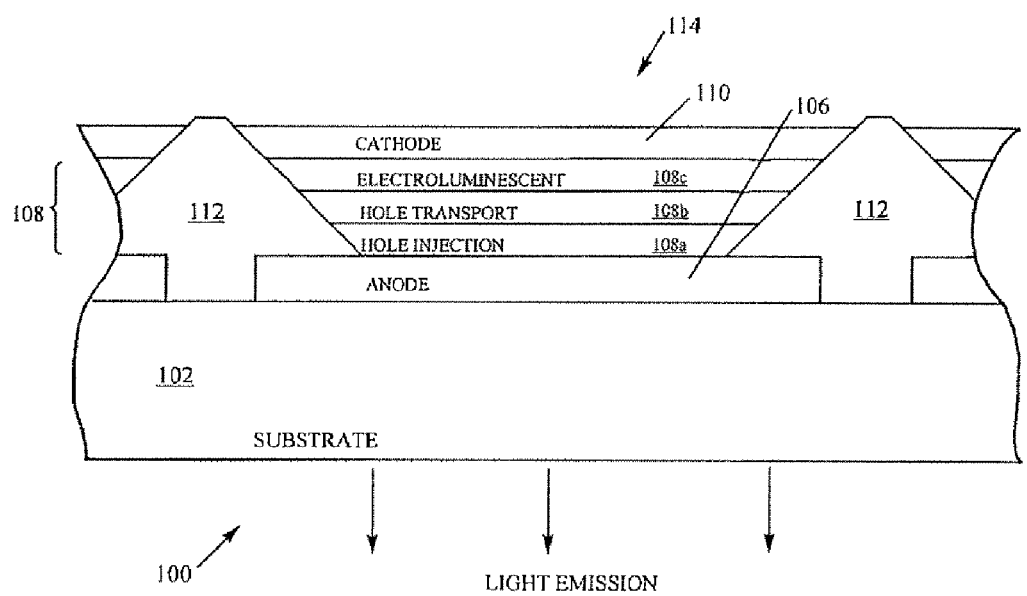
FIG. 2 shows a vertical cross section through an example of an OLED.

FIG. 2 shows a vertical cross section through an example of an OLED device 100. In an active matrix display, part of the area of a pixel is occupied by associated drive circuitry (not shown in FIG. 2). The structure of the device is somewhat simplified for the purposes of illustration.

The OLED 100 comprises a substrate 102, typically 0.7 mm or 1.1 mm glass but optionally clear plastic, on which an anode layer 106 has been deposited. The anode layer typically comprises around 150 nm thickness of ITO (indium tin oxide), over which is provided a metal contact layer, typically around 500 nm of aluminium, sometimes referred to as anode metal. Glass substrates coated with ITO and contact metal may be purchased from Corning, USA. The contact metal (and optionally the ITO) is patterned as desired so that it does not obscure the display, by a conventional process of photolithography followed by etching.

A substantially transparent conducting hole injection layer 108a is provided over the anode metal, followed by the semiconducting hole transport layer 108b and an electroluminescent layer 108c. Banks 112 may be formed on the substrate, for example from positive or negative photoresist material, to define wells 114 into which these active organic layers may be selectively deposited. The wells thus define light emitting areas or pixels of the display.

A cathode layer 110 is then applied by, for example, physical vapour deposition. The cathode layer typically comprises a low work function metal such as calcium or barium covered with a thicker, capping layer of aluminium and optionally including an additional layer immediately adjacent the electroluminescent layer, such as a layer of lithium fluoride, for improved electron energy level matching. Mutual electrical isolation of cathode lines may achieved through the use of cathode separators. Typically a number of displays are fabricated on a single substrate and at the end of the fabrication process the substrate is scribed, and the displays separated. An encapsulant such as a glass sheet or a metal can is utilized to inhibit oxidation and moisture ingress.

The edges or faces of the banks are tapered onto the surface of the substrate as shown, typically at an angle of between 10 and 40 degrees. The banks present a hydrophobic surface in order that they are not wetted by the solution of deposited organic material and thus assist in containing the deposited material within a well. This is achieved by treatment of a bank material such as polyimide with an $O_2/CF_4$ plasma as disclosed in EP 0 989 778. Alternatively, the plasma treatment step may be avoided by use of a fluorinated material such as a fluorinated polyimide as disclosed in WO 03/083960.

The bank and separator structures may be formed from resist material, for example using a positive (or negative) resist for the banks and a negative (or positive) resist for the separators; both these resists may be based upon polyimide and spin coated onto the substrate, or a fluorinated or fluorinated-like photoresist may be employed.

The invention claimed is:

1. A composition suitable for fabricating an electronic device using a printing technique such as ink jet printing, roll printing, or screen printing, the composition comprising a conducting or semiconducting organic material and a solvent, the solvent having a boiling point of greater than 250° C. and a viscosity of less than 5 cPs and having formula I:

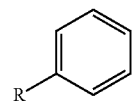

I where R represents a linear $C_8$ to $C_{10}$ alkyl.

2. A composition according to claim 1, wherein the composition has a viscosity in the range between 0.1 and 20 cPs.

3. A composition according to claim 1, wherein the conducting or semiconducting organic material comprises a polymer.

4. A composition according to claim 1, wherein the conducting or semiconducting organic material is a semiconducting luminescent material.

5. A composition according to claim 4, wherein the semiconducting luminescent material is a semiconducting luminescent polymer.

6. A composition according to claim 1, wherein the conducting or semiconducting organic material is a semiconducting hole transport material.

7. A composition according to claim 6, wherein the semiconducting hole transport material is a semiconducting hole transport polymer comprising a triarylamine repeat unit.

8. A composition according to claim 1 including a single solvent.

9. A composition according to claim 1, including a solvent blend comprising two or more solvents.

10. A composition according to claim 9, wherein the solvent blend comprises a first solvent having a boiling point of greater than 250° C. and a viscosity of less than 5 cPs and a second solvent having a lower boiling point than the first solvent.

11. A composition according to claim 10, wherein the second solvent is selected from the group consisting of: 4-methylanisole, mesitylene, butylbenzene and ortho-xylene.

12. A composition according to claim 1 in which the solvent does not contain oxygen.

13. A method of forming an organic semiconductor device including depositing a composition as defined in claim 1 by ink-jet printing, roll printing or screen printing to form a layer.

14. A composition according to claim 1, wherein R represents a linear $C_9$ alkyl.

15. A composition suitable for fabricating an electronic device using a printing technique such as ink jet printing, roll printing, or screen printing, the composition comprising a conducting or semiconducting organic material and a solvent, the solvent having a boiling point of greater than 250° C. and a viscosity of less than 5 cPs and having formula I:

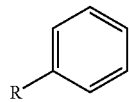

where R represents a $C_6$ to $C_{11}$ alkyl,
wherein the conducting or semiconducting organic material is a conducting hole injection material.

16. A composition according to claim 15, wherein R represents a $C_7$ to $C_{11}$ alkyl.

17. A composition according to claim 15, wherein R represents a $C_8$ to $C_{10}$ alkyl.

18. A composition according to claim 15, wherein R represents a linear $C_8$ to $C_{10}$ alkyl.

19. A composition according to claim 15, wherein the conducting hole injection material comprises poly(ethylene dioxythiophene) (PEDT) doped with polystyrene sulfonate (PSS).

20. A composition according to claim 15, wherein R represents a $C_9$ alkyl.

21. A composition suitable for fabricating an electronic device using a printing technique such as ink jet printing, roll printing, or screen printing,
the composition comprising a conducting or semiconducting organic material and a solvent blend comprising a first solvent and a second solvent, the first solvent having a boiling point of greater than 250° C. and a viscosity of less than 5 cPs and having formula I:

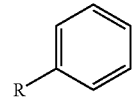

where R represents a $C_6$ to $C_{11}$ alkyl,
wherein the solvent blend is a 1:1 blend of the first solvent and the second solvent.

22. A composition according to claim 21, wherein the solvent blend comprises a first solvent having a boiling point of greater than 250° C. and a viscosity of less than 5 cPs and a second solvent having a lower boiling point than the first solvent.

23. A composition according to claim 22, wherein the second solvent is selected from the group consisting of: 4-methylanisole, mesitylene, butylbenzene and ortho-xylene.

\* \* \* \* \*